US008742963B2

(12) United States Patent
Zou et al.

(10) Patent No.: US 8,742,963 B2
(45) Date of Patent: Jun. 3, 2014

(54) RECORDING CIRCUIT AND A METHOD OF CONTROLLING THE SAME

(75) Inventors: Xiaodan Zou, Singapore (SG); Jia Hao Cheong, Singapore (SG); Lei Yao, Singapore (SG); Minkyu Je, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 0 days.

(21) Appl. No.: 13/605,222

(22) Filed: Sep. 6, 2012

(65) Prior Publication Data

US 2013/0063290 A1   Mar. 14, 2013

(30) Foreign Application Priority Data

Sep. 9, 2011   (SG) .............................. 201106497-9

(51) Int. Cl.
*H03M 1/00* (2006.01)
(52) U.S. Cl.
USPC .......................................... 341/141; 341/155
(58) Field of Classification Search
USPC ................... 341/141, 155, 156, 172, 120
See application file for complete search history.

(56) References Cited

U.S. PATENT DOCUMENTS

| 5,349,351 | A | * | 9/1994 | Obara et al. | ................... | 341/141 |
| 5,412,386 | A | * | 5/1995 | Sezi | .............................. | 341/141 |
| 7,626,524 | B2 | | 12/2009 | Horie | | |
| 2001/0056450 | A1 | * | 12/2001 | Kiriaki | .......................... | 708/300 |

OTHER PUBLICATIONS

Hochberg, et al., Neuronal Ensemble Control of Prosthetic Devices by a Human with Tetraplegia, 442, Nature, 164 (2006).
Schwartz, Cortical Neural Prosthetics, 27 Annual Review of Neuroscience, 487 (2004).
Schwartz, et al., Brain-Controlled Interfaces: Movement Restoration with Neural Prosthetics, 52 Neuron, 205 (2006).
Harrison, et al., A Low-Power Integrated Circuit for a Wireless 100-Electrode Neural Recording System, 42 IEEE Journal of Solid-State Circuits, 123 (2007).
Chae, et al., A 128-Channel 6 mW Wireless Neural Recording IC with on-the-Fly Spike Sorting and UWB Transmitter, IEEE ISSCC Dig. Tech. Papers, 146 (2008).
Aziz, et al., 256-Channel Neural Recording and Delta Compression Microsystem with 3D Electrodes, 44 IEEE Journal of Solid-State Circuits, 995 (2009).
Olsson, et al., Band-Tunable and Multiplexed Integrated Circuits for Simultaneous Recording and Stimulation with Microelectrode Arrays, 52 IEEE Trans. on Biomedical Engineering, 1303 (2005).
Olsson, et al., A Three-Dimensional Neural Recording Microsystem With Implantable Data Compression Circuitry, 40 IEEE Journal of Solid-State Circuits, 2796 (2005).
Wu, et al., A 1V 2.3µw Biomedical Signal Acquisition IC, IEEE ISSCC Dig. Tech. Papers, 58 (2006).
Microchip Technology, Inc., 10-Bit ADC with 4 Simultaneous Conversions, (2010), http://ww1.microchip.com/downloads/en/devicedoc/39737a.pdf.
Vasuki, dsPIC30F 10-Bit ADC Module (part 2), Microchip Technology, Inc., (2010), http://www.microchip.com/stellent/idcplg?IdcService=SS_GET_PAGE&nodeId=1824&appnote=en528183.

* cited by examiner

*Primary Examiner* — Joseph Lauture
(74) *Attorney, Agent, or Firm* — K. David Crockett, Esq.; Niky Economy Syrengelas, Esq.; Crockett & Crockett, PC

(57) ABSTRACT

A recording circuit is provided. The recording circuit includes a multiplexing circuit configured to receive a plurality of input signals and to produce a multiplexed output signal including the plurality of input signals, and a plurality of sampling circuits electrically coupled in parallel to each other, each sampling circuit being configured to sample a portion of the multiplexed output signal corresponding to an input signal of the plurality of input signals and the sampling circuits configured to alternately produce an output signal corresponding to the sampled portion.

13 Claims, 6 Drawing Sheets

RECORDING CIRCUIT AND A METHOD OF CONTROLLING THE SAME

This application claims the benefit of priority of Singapore patent application No. 201106497-9, filed 9 Sep. 2011, the content of it being hereby incorporated by reference in its entirety for all purposes.

FIELD OF THE INVENTIONS

Various embodiments relate to a recording circuit and a method of controlling the recording circuit.

BACKGROUND OF THE INVENTIONS

Simultaneous recording of neuropotentials over a large number of electrodes from the brain provides an effective way for neuroscientists and clinicians to study the brain state dynamics and understand the nature of various neurophysiological behaviors. It has a wide range of applications, including the development of brain controlled neural prostheses, which are controlled directly by thoughts. Recent clinical trials with paralyzed human volunteers have shown that it is possible to restore limb movement by such kind of neuroprosthetic devices. This calls for the development of low-power low-voltage implantable multi-channel neural recording interface integrated circuit (IC).

Effective and reliable neural research and diagnosis rely on multi-channel recordings. High density recording channels from 100 to as high as 256 are possible. On the other hand, a recording microsystem implanted in the brain requires extremely rigid requirement on power consumption of the high density recording electronics, as slightly higher heat dissipation will induce damage to the surrounding tissue, thus making the device not suitable for long term monitoring. In addition, the power of implantable devices is usually provided either by battery or through wireless power link. In order to avoid frequent replacement of battery or excessive electromagnetic wave exposure to live subjects, low power consumption is especially critical. Meanwhile, chip area is also a key constraint for implantable device to minimize the surgical damage. Therefore, the requirements of ultra low power consumption, minimum chip area and high density recording provide a great challenge to IC designers.

Conventional multi-channel biomedical recording sensor interface IC requires signal conditioning and digitization blocks, which are usually realized by low-noise preamplifier and analog-to-digital converter (ADC). Successive approximation ADC (SAR ADC) is widely adopted in biomedical recording system due to its low power, high resolution and moderate speed. Due to chip area restraint, one ADC is usually shared by multiple analog front-end recording channels by employing an n-to-1 multiplexer as shown in FIG. 1A to be described later, where n is the number of channels sharing one ADC. In order to preserve the sampling frequency for each channel, the sampling frequency of the ADC needs to be increased to n times of the sampling frequency for one channel mode. As there is only one sample and hold (S/H) circuit in the system, all activities of the ADC take place in series. Increasing the sampling frequency means a shorter time for tracking and conversion, which are two essential actions for the SAR ADC. Therefore, a much higher driving capability buffer is required to maintain the tracking error within an acceptable range due to the shorter tracking time. As a result, the power consumption of the overall system will increase, which is not desirable for implantable devices.

Efforts have been made in designs to reduce the power consumption of individual functional block, such as the low-noise preamplifier and the ADC, which can be realized with few µW power consumption. However, little has been done in optimizing the overall system power consumption. Due to the shortened tracking time of the conventional multi-channel system architecture, an associated preceding buffer of the ADC can draw tens of µW power, thereby overriding any reduction in the power of the preamplifier and the ADC, and resulting in a high total power consumption of the system.

In order to maintain low enough power consumption, some conventional designs adopt data compression or spike detection algorithm to minimize the power consumption. However, this approach may lose some useful information and lead to inaccurate outcome. Therefore, complete and raw neural data are preferred for neural activity analysis and diagnosis. As a result, an ADC with at least 8-bit resolution is necessary in a neural recording system.

An alternative approach to reduce the system power is to implement one sample and hold (S/H) circuit for each analog recording channel, as shown in FIG. 2A to be described later. By doing so, the tracking time of the ADC is extended to maximum and the power consumption of the buffer is minimized. However, the area of one S/H circuit is almost equal to the ADC area. Therefore, employing one S/H circuit per channel will significantly increase the area of the overall system.

In order to reduce the chip area of a biomedical recording IC, multi-channel analog signals are usually multiplexed to share one ADC, as shown in FIG. 1A. FIG. 1A shows a schematic diagram of a conventional multiplexed multi-channel recording system 100. The conventional recording system 100 includes a plurality of buffers 102a, 102b, 102c, each providing an analog input 103a, 103b, 103c, corresponding to respective analog channels, to a multiplexer 104. The recording system 100 further includes a single sample and hold (S/H) circuit 106 coupled in series with the multiplexer (MUX) 104, and providing an output signal to the analog to digital converter (ADC) (e.g. SAR ADC) 108. The S/H circuit 106 may be within the ADC 108. While three buffers 102a, 102b, 102c, and three analog inputs 103a, 103b, 103c are shown, there may be n number of buffers providing n number of analog inputs (e.g. n may be 10).

For the recording system 100, the n-channel (multi-channel) analog inputs (e.g. 103a, 103b, 103c) occupy the ADC 108 in time sharing basis. For example, if the input analog signal is within the bandwidth of $f_{signal}$, the sampling frequency of the ADC 108 is at least ($2nf_{signal}$) according to the Nyquist rate, and the ADC 108 allocates a time period of $T_{ADC}=1/(2nf_{signal})$ to each analog channel of the respective analog inputs 103a, 103b, 103c, through the n-bit control signal of the multiplexer 104. Before digitization by the ADC 108 takes place, the S/H circuit 106 needs to track or sample the analog input voltage level and stores it in a sampling capacitor of the S/H circuit 106. The tracking (or sampling) process occupies a time partially of the $T_{ADC}$. For a conventional SAR ADC, the tracking/sampling period, $T_{sample}$, is $1/(N+1)$ of $T_{ADC}$, and the conversion (or holding) period $T_{conv}$ is $[N/(N+1)]$ of $T_{ADC}$ for a N-bit ADC, where N is the number of bits of the ADC 108.

FIG. 1B shows a schematic diagram of a timing diagram 120 for the recording system 100 of FIG. 1A, illustrating the time sharing scheme of the recording system 100. The time interval indicated by 'S' represents the sampling period and the respective time intervals indicated by 'H1', 'H2', ..., 'Hn' represent the conversion periods of the S/H circuit 106 and the ADC 108. Using channel 1, Ch1, corresponding to an analog input, as a non-limiting example, the block 'S' 122a and the block 'H1' 122b respectively represent the sampling period, with a time interval of $T_{ADC}/(N+1)$, and the conversion period, with a time interval of $[T_{ADC}N/(N+1)]$, related to Ch1. The cycle time or period between successive same channels is $1/(2f_{signal})$. It should be appreciated that the various time intervals/durations are for illustration purposes and not drawn to scale.

During the sampling period of one analog input channel, e.g. Ch1, Ch2, Ch3, or one analog input 103a, 103b, 103c, the multiplexer 104 connects the buffer output of this channel with the S/H capacitor of the S/H circuit 106 or the ADC 108, such that the buffer (e.g. 102a, 102b, 102c) will charge or discharge the S/H capacitor, and the current output voltage level of the buffer (e.g. 102a, 102b, 102c) will be stored in the S/H capacitor. The required output current of the buffer (e.g. 102a, 102b, 102c), $I_{buffer}$, can be expressed by the following equation:

$$I_{buffer} = \frac{C_s \times \Delta V}{T_{sample}} = 2nf_{signal}(N+1)C_s \Delta V, \qquad \text{(Equation 1)}$$

where $C_s$ is the sampling capacitance of the S/H capacitor of the ADC 108 and $\Delta V$ is the voltage difference between the buffer output of the current channel and the previous channel at the time when sampling/tracking of the current channel starts, $T_{sample}$ is the sampling period, n is the number of analog inputs (e.g. 103a, 103b, 103c) or input channels, $f_{signal}$ is the bandwidth of an input analog signal (e.g. 103a, 103b, 103c) and N is the number of bits of the ADC 108.

In addition, the bandwidth of the buffer (e.g. 102a, 102b, 102c), $f_{buffer}$, needs to fulfill the following equations in order to maintain the tracking error within half least significant bit (LSB) of the ADC 108:

$$\Delta V \times [e^{\wedge}(-T_{sample} \times 2\pi f_{buffer})] \leq \frac{1}{2} \times \frac{V_{pp}}{2^N}, \qquad \text{(Equation 2)}$$

where '^' represents a power operation, e.g. $e^{\wedge}5 = e^5$. Therefore, by re-arranging Equation 2, Equations 3 and 4 below may be obtained;

$$f_{buffer} \geq \frac{1}{2\pi T_{sample}} \ln\left(\frac{2^{N+1}\Delta V}{V_{pp}}\right), \qquad \text{(Equation 3)}$$

and, $$f_{buffer} \geq \frac{nf_{signal}(N+1)}{\pi} \ln\left(\frac{2^{N+1}\Delta V}{V_{pp}}\right), \qquad \text{(Equation 4)}$$

where $V_{PP}$ is the full-scale input range of the ADC 108.

As can be seen from Equations 1 and 4, both the required output current of the buffer (e.g. 102a, 102b, 102c), $I_{buffer}$, and the bandwidth of the buffer (e.g. 102a, 102b, 102c), $f_{buffer}$, are proportional to n(N+1). In other words, the current drawn by each buffer (e.g. 102a, 102b, 102c) is proportional to the resolution (N-bit) of the ADC 108 and the number, n, of channels that the ADC 108 is supporting. In fact, this is an optimistic estimation as the current required to achieve the bandwidth of $nf_{signal}$ is larger than nI, where I is the current needed to achieve the bandwidth of $f_{signal}$, due to the fact that the parasitic capacitances play more and more important roles in high frequency range and therefore more current is needed to compensate for the parasitic capacitances. With the increase of n, the power consumption of the buffer (e.g. 102a, 102b, 102c) will increase significantly, even for a moderate resolution of the ADC 108. For example, using a conventional multiplexed system structure, the buffer may draw a current of 20.3 μA while the preamplifier draws a current of only 2 μA. Therefore, the buffer (e.g. 102a, 102b, 102c) is the dominant power consumer in the recording system 100 and more effort is needed to minimize the buffer current, as well as the total power of the recording system 100. Therefore, the recording system 100 is power inefficient.

One conventional approach used to lower the power consumption of the buffer is employing a dedicated sample and hold (S/H) circuit for each analog input channel, as shown in FIG. 2A. FIG. 2A shows a schematic diagram of a conventional multiplexed multi-channel recording system 200. The recording system 200 includes a plurality of buffers 202a, 202b, 202c, each providing an analog input 203a, 203b, 203c, to a sample and hold (S/H) circuit 206a, 206b, 206c. The analog signals 203a, 203b, 203c are sampled by the respective sample and hold (S/H) circuits 206a, 206b, 206c before being provided to the multiplexer (MUX) 204 and then passed to the analog to digital converter (ADC) 208 for digitization. While three buffers 202a, 202b, 202c, three analog inputs 203a, 203b, 203c and three S/H circuits 206a, 206b, 206c are shown, there may be n number of buffers providing n number of analog inputs and sampled by n number of S/H circuits (e.g. n may be 10).

By adopting such a system structure, the tracking (or sampling) time is extended from $T_{ADC}/(N+1)$ (FIGS. 1A and 1B) to $(n-1)T_{ADC}$ as shown in FIG. 2B, which leads to a significant reduction of the buffer current according to Equation 1. FIG. 2B shows a schematic diagram of a timing diagram 220 for the recording system 200 of FIG. 2A. As shown in FIG. 2B, the S/H circuit, S/H1 (e.g. 206a), may process the input signal 222a of channel 1, Ch1, while S/H2 (e.g. 206b) may process the input signal 222b of channel 2, Ch2, S/H3 may process the input signal 222c of channel 3, Ch3, and S/Hn may process the input signal 222d of channel n, Chn.

The respective time intervals indicated by 'S1', 'S2', . . . , 'Sn' represent the sampling period and the respective time intervals indicated by 'H1', 'H2', . . . , 'Hn' represents the conversion period of the respective S/H circuit, S/H1, S/Hn, corresponding to the respective channels, Ch1, Chn. Using channel 1, Ch1, corresponding to the analog input 222a, as a non-limiting example, the blocks 'S1' 224a and the blocks 'H1' 224b respectively represent the sampling period, with a time duration of $(n-1) T_{ADC}$, and the conversion period, with a time interval of $T_{ADC}$, related to Ch1. The cycle time or period between successive conversion actions of each S/H circuit is $1/(2f_{signal})$. It should be appreciated that the various time intervals/durations are for illustration purposes and not drawn to scale.

With the sampling time of the ADC 208 extended to $2T_{ADC}$ or more (e.g. $T_{sample} \geq 2T_{ADC}$), the power consumption of the buffer (e.g. 202a, 202b, 202c) is no longer dominant in the system. However, a longer sampling time, of more than $2T_{ADC}$, has very little further effect on the total system power, and therefore, having one S/H circuit per input channel may not substantially further reduce the total system power.

In addition, such a multi-channel S/H recording system 200 requires n number of S/H capacitors for the n number of S/H circuits (e.g. 206a, 206b, 206c), which is usually in the range of 3 pF to 5 pF for each capacitor to minimize the effect of parasitic capacitance and maintain the digitization error within an acceptable range. For an SAR ADC, the area of the sampling capacitor takes up about half of the total area of the overall ADC. When the number of channels increases (i.e. n increases), the physical area of the system will increase dramatically due to the increased number of sampling capacitors. Therefore, the recording system 200 is area inefficient. As a result, this multi-channel S/H approach of the recording system 200 is not suitable for implantable biomedical devices or applications with limited chip area constraint.

SUMMARY

According to an embodiment, a recording circuit is provided. The recording circuit may include a multiplexing circuit configured to receive a plurality of input signals and to produce a multiplexed output signal including the plurality of input signals, and a plurality of sampling circuits electrically coupled in parallel to each other, each sampling circuit being configured to sample a portion of the multiplexed output signal corresponding to an input signal of the plurality of input signals and the sampling circuits configured to alternately produce an output signal corresponding to the sampled portion.

According to another embodiment, a method of controlling a recording circuit is provided. The method may include multiplexing a plurality of input signals to produce a multiplexed output signal, sampling a portion of the multiplexed output signal corresponding to an input signal of the plurality of input signals via each sampling circuit of a plurality of sampling circuits electrically coupled in parallel to each other, and producing alternately an output signal corresponding to the sampled portion from the sampling circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF THE INVENTIONS

Figure 1A:
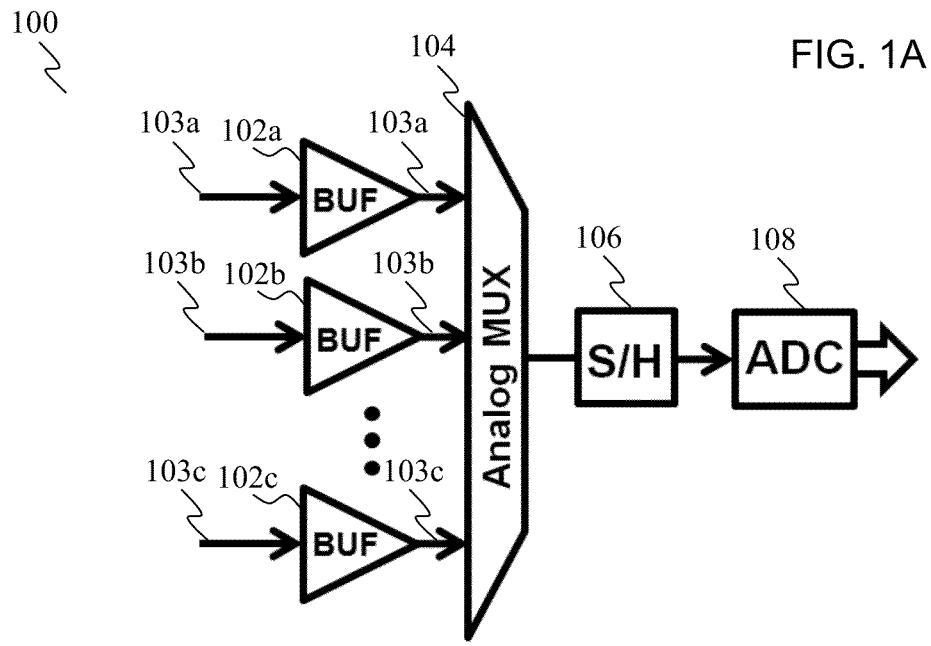
FIG. 1A shows a schematic diagram of a conventional multiplexed multi-channel recording system.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of a device are analogously valid for a method, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the phrase "at least substantially" may include "exactly" and a variance of +/−5% thereof. As an example and not limitations, "A is at least substantially same as B" may encompass embodiments where A is exactly the same as B, or where A may be within a variance of +/−5%, for example of a value, of B, or vice versa.

In the context of various embodiments, the term "about" or "approximately" as applied to a numeric value encompasses the exact value and a variance of +/−5% of the value.

As used herein, the term "and/or" includes any and all combinations of one or more of the associated listed items.

Multi-channel recording and simultaneous digitization of recorded data may be necessary for many biomedical applications, where power consumption and chip area are very critical benchmarks. The existing multi-channel biomedical recording system architectures either consume very high power, or occupy large chip area, which is undesirable for portable or implantable biomedical devices. In view of these, various embodiments may provide power efficient and chip area efficient recording circuits, where the sample and hold actions are processed in parallel, using multiple sample-and-hold (S/H) circuits in the recording circuits, for example for a multiplexed analog-to-digital converter (ADC), e.g. for multi-channel biomedical recording systems or devices. In various embodiments, the multiple sample-and-hold (S/H) circuits may be provided in the analog-to-digital converter (ADC). The recording circuits of various embodiments may achieve more than 600% power reduction with minimal chip area increment, and more than 300% area reduction, compared to conventional multi-channel systems. Optimal or balance in the power and area trade-off may be realized by using the circuit architectures of various embodiments for different applications. Therefore, the recording circuits of various embodiments may be power efficient and/or chip area efficient.

Various embodiments may provide a power and area efficient multi-channel recording circuit and recording system. Various embodiments may provide a power and area efficient circuit architecture for multi-channel biomedical recording systems. Various embodiments may provide a circuit arrangement or architecture incorporating a plurality of sample and hold (S/H) circuits coupled in parallel to each other, for multi-channel recording systems. The recording circuits of various embodiments may extend the tracking (or sampling) time of the S/H circuits by, for example, 10 times for a 9-bit successive-approximation analog-to-digital converter (SAR ADC), leading to more than 10 times power saving for the associated buffers. At the same time, any increment in the chip area may be minimal. In addition, the recording circuits of various embodiments may offer high flexibility on the circuit architecture and may provide an approach to achieve optimal trade-off between the power and the chip area for the recording circuits for different applications.

The recording circuits of various embodiments may provide high efficiency in both circuit power consumption, and the overall system power, and the chip area. The recording circuits of various embodiments may be applied to any multi-channel systems, for example including multi-channel systems which require low power and a small chip area. In one embodiment, dual S/H circuits may be employed, which perform the sample and hold actions in a parallel mode, leading to an extended tracking time of the ADC and more than 10 times current saving for the associated preceding buffers. At the same time, the recording circuits of various embodiments preserve a small chip area compatible with designs with very tight area budget. In addition, the approach of various embodiments provides flexibility to customize different recording circuit designs or architectures, by choosing a suitable number of S/H circuits for a multi-channel recording system to fit different power consumption and/or chip area requirements.

Various embodiments may provide a multi-channel recording circuit architecture including multi-channel (e.g. n-channel, n≥2, e.g. 2, 3, 4, 5 or any higher number) analog inputs, an n-to-1 multiplexer (MUX), multiple S/H circuits, e.g. coupled to the output of the multiplexer, and an ADC to digitize the n-channel analog inputs.

Various embodiments may provide a method for extending the sampling (tracking) time of the ADC, by employing dual S/H circuits, coupled in parallel, to sample n-channel analog inputs (e.g. n≥2, e.g. 2, 3, 4, 5 or any higher number), in which, when in operation, one S/H circuit is in a sampling phase while the other S/H circuit is in a holding phase, so as to extend the sampling time by utilizing the conversion time of the previous channel using the two S/H circuits.

Various embodiments may provide a method for reducing the circuit/system power consumption, including providing one or more buffers to drive a plurality of S/H circuits, reducing the power consumption of the buffer(s) by extending the sampling time of the S/H circuits, and extending the ADC conversion time to reduce the clock frequency of the ADC logic so as to reduce the power consumption of the ADC logic.

Various embodiments may provide a method for optimising system power and chip area, including providing two or more S/H circuits, coupled in parallel, where the number of S/H circuits may depend on the applications and/or the circuit power requirements and/or the circuit chip area requirements, in which the more S/H circuits that are provided, the circuit power is reduced while the chip size is increased, and vice versa, and optimising the power and area trade-off by selecting a suitable number of S/H circuits.

Figure 3A:
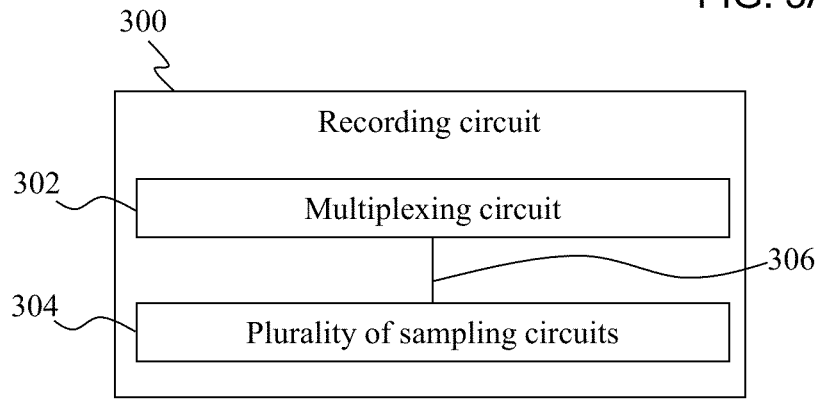
FIG. 3A shows a schematic block diagram of a recording circuit, according to various embodiments.

FIG. 3A shows a schematic block diagram of a recording circuit 300, according to various embodiments. The recording circuit 300 includes a multiplexing circuit 302 configured to receive a plurality of input signals and to produce a multiplexed output signal including the plurality of input signals, and a plurality of sampling circuits 304 electrically coupled in parallel to each other, each sampling circuit 304 being configured to sample a portion of the multiplexed output signal corresponding to an input signal of the plurality of input signals and the sampling circuits 304 configured to alternately produce an output signal corresponding to the sampled portion. The line represented as 306 is illustrated to show the relationship between the multiplexing circuit 302 and the plurality of sampling circuits 304, which may include electrical coupling and/or mechanical coupling.

In other words, the multiplexing circuit 302 may receive a plurality of input signals, for example via a plurality of input terminals (e.g. n number of input terminals for receiving n number of input signals) of the multiplexing circuit 302, and produce or generate a multiplexed output signal made up of the plurality of input signals, and which may be supplied from the multiplexing circuit 302 via an output terminal. In various embodiments, a multiplexed output signal may be a sequence of the plurality of input signals. Accordingly, the multiplexing circuit 302 may be an n-to-1 multiplexing circuit or multiplexer (MUX).

The plurality of sampling circuits 304 may sample a portion of the multiplexed output signal corresponding to an input signal of the plurality of input signals. As a non-limiting example, a first sampling circuit 304 may sample a portion of the multiplexed output signal corresponding to a first input signal, while a second sampling circuit 304 may sample a portion of the multiplexed output signal corresponding to a second input signal.

In various embodiments, the same sampling circuit 304 may sample portions of the multiplexed output signal corresponding to different input signals, as the recording circuit 300 cycles through the plurality of input signals.

For example, in embodiments with two sampling circuits 304, sampling by the same sampling circuit 304 may be repeated after every two input signals, i.e. the first sampling circuit 304 may sample the first input signal, the third input signal and so on, while the second sampling circuit 304 may sample the second input signal, the fourth input signal and so on.

For example, in embodiments with three sampling circuits 304, sampling by the same sampling circuit 304 may be repeated after every three input signals, i.e. the first sampling circuit 304 may sample the first input signal, the fourth input signal and so on, the second sampling circuit 304 may sample the second input signal, the fifth input signal and so on, while the third sampling circuit 304 may sample the third input signal, the sixth input signal and so on.

The plurality of sampling circuits 304 may perform the sampling process in a parallel mode but alternately produce an output signal from the sampling circuits 304 corresponding to the sampled portion. For example, this may be achieved where there is a delay between the sampling start time for each sampling circuit 304 while the sampling time interval or the overall sampling time interval for each sampling circuit 304 is at least substantially the same. In other words, the multiplexing circuit 302 may provide the multiplexed output signal to each sampling circuit 304 at a delayed time interval from one sampling circuit 304 to another sampling circuit 304. Therefore, there may be an overlap in the sampling time intervals of the plurality of sampling circuits 304 at a particular time.

As the plurality of sampling circuits 304 may perform the sampling and holding actions in a parallel mode, conversion for each channel by the ADC is continuous. In other words, there is no rest time for the ADC for performing conversions of the plurality of analog inputs.

In various embodiments, the recording circuit 300 may further include an analogue-to-digital converter (ADC) configured to receive the output signal. The ADC receives the output signal and converts the output signal into a digital signal, i.e. the ADC digitizes the output signal. In various embodiments, one or more or all of the plurality of sampling circuits 304 may be separate from the ADC or may be part of the ADC.

In various embodiments, as the plurality of sampling circuits 304 alternately produce an output signal corresponding to the sampled portion of the multiplexed output signal, the ADC converts the output signal from each sampling circuit 304 alternately to a digital signal.

In various embodiments, the recording circuit 300 may further include a plurality of buffers, where each buffer may be configured to supply an input signal of the plurality of input signals to the multiplexing circuit 302. Each buffer may be a memory and may store the input signal prior to being supplied to the multiplexing circuit 302.

In the context of various embodiments, the number of the plurality of sampling circuits 304 may be less than the number of the plurality of input signals. This means that the same sampling circuit 304 may be employed to process or sample different portions of the multiplexed output signal corresponding different input signals.

In the context of various embodiments, the plurality of sampling circuits 304 may be two sampling circuits 304, three sampling circuits 304, four sampling circuits 304 or any higher number of sampling circuits 304, depending on the applications and/or the circuit power requirements and/or the circuit area requirements.

Figure 3B:
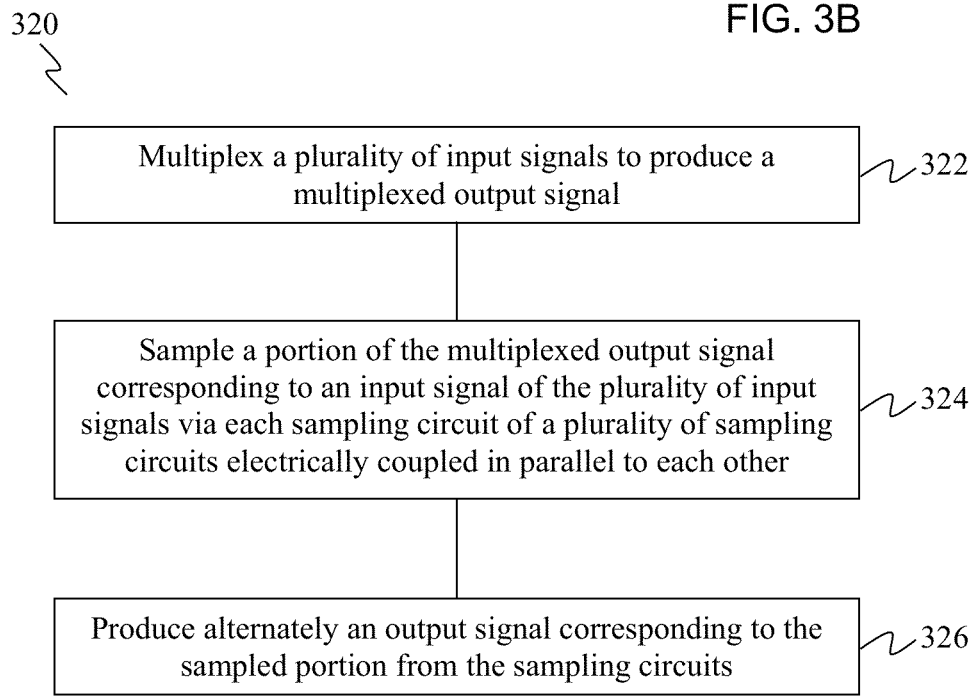
FIG. 3B shows a flow chart illustrating a method of controlling a recording circuit, according to various embodiments.

FIG. 3B shows a flow chart 320 illustrating a method of controlling a recording circuit, according to various embodiments.

At 322, a plurality of input signals is multiplexed to produce a multiplexed output signal.

At 324, a portion of the multiplexed output signal corresponding to an input signal of the plurality of input signals is sampled via each sampling circuit of a plurality of sampling circuits electrically coupled in parallel to each other.

At 326, an output signal corresponding to the sampled portion is produced alternately from the sampling circuits.

In various embodiments, the method may further include converting the output signal to a digital signal. This conversion may be performed over or in a time interval, $T_{conv}$, defined by $T_{conv}=1/(2nf_{signal})$, where n refers to the number of the plurality of input signals and $f_{signal}$ refers to a bandwidth of each input signal of the plurality of input signals.

In various embodiments, at 324, the portion of the multiplexed output signal may be sampled over or in a time interval, $T_{sample}$, defined by $T_{sample}=(m-1)/(2nf_{signal})$, where m refers to the number of the plurality of sampling circuits, n refers to the number of the plurality of input signals and $f_{signal}$ refers to a bandwidth of each input signal of the plurality of input signals.

In various embodiments, the number of the plurality of sampling circuits may be less than the number of the plurality of input signals.

In the context of various embodiments, the method includes sampling the multiplexed output signal via two sampling circuits, three sampling circuits, four sampling circuits or any higher number of sampling circuits, depending on the applications and/or the circuit power requirements and/or the circuit area requirements.

In the context of various embodiments, each input signal may be an analog input signal.

In the context of various embodiments, each input signal may correspond to an input channel. In other words, a particular input signal may be from a particular input channel.

In the context of various embodiments, the term "multiplexing circuit" may mean or may include a multiplexer (MUX). The multiplexer may be an analog multiplexer.

In the context of various embodiments, the terms "multiplex" and "multiplexing" may mean combining a plurality of signals into one signal for transmission over a common line, medium or channel.

In the context of various embodiments, the term "sampling circuit" may mean or may include a sample and hold (S/H) circuit. The S/H circuit may be an analog circuit that samples (e.g. captures) an amplitude of a continuously varying analog signal and holds (e.g. locks) its value at a constant level for a particular time interval.

In various embodiments, the S/H circuit may include a capacitor which, for example, may be charged during the "sample" mode, thereby resulting in a voltage across the capacitor, and which may hold the charge during the "hold" mode, and thereby at least substantially maintaining the voltage across the capacitor, within the particular hold time interval.

In the context of various embodiments, the terms "sample" and "sampling" may mean a step or process of performing measurements at intervals (e.g. regular intervals) of the amplitude of a continuous and/or varying signal/waveform. In other words, the continuous signal may be approximately represented by a series of discrete values, thereby reducing the continuous signal to a discrete signal. The terms "sample" and "sampling" may be interchangeably used with the terms "track" and "tracking".

In the context of various embodiments, the terms "convert" and "converting" as used in the context of producing a digital signal may be interchangeably used with the terms "hold" and "holding". The time interval for "converting" a signal to a digital signal by an ADC may be equivalent to the time interval for "holding" a signal that is sampled by a S/H circuit.

In the context of various embodiments, the terms "couple" and "coupled" may include electrical coupling which may allow a current to flow, and/or mechanical coupling.

In the context of various embodiments, a reference to the terms "couple" or "coupled" with regard to two or more components may include a reference to "directly coupled" or "indirectly coupled", e.g. including one or more other components (e.g. resistor and/or inductor and/or capacitor) connected therebetween the two or more components.

Figure 4A:
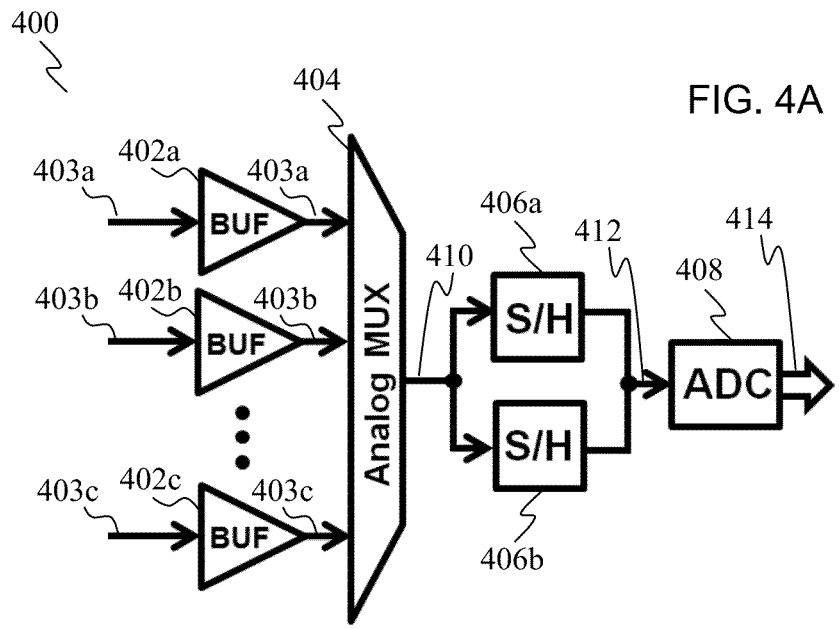
FIG. 4A shows a schematic diagram of a recording circuit, according to various embodiments.

FIG. 4A shows a schematic diagram of a recording circuit 400, according to various embodiments, incorporating a dual sample and hold (S/H) scheme for a multi-channel system, in order to achieve both requirements of low power consumption and small chip area to provide a power efficient and an area efficient recording circuit. The recording circuit 400 may be employed to record a plurality of signals from a plurality of analog channels, for example n channels (e.g. n may be 10). The analog recording channels may be multiplexed to the two S/H circuits.

The recording circuit 400 includes a plurality of buffers 402a, 402b, 402c, each buffer 402a, 402b, 402c receiving and providing a respective analog input 403a, 403b, 403c, to a multiplexer (MUX) (or a multiplexing circuit) 404. The recording circuit 400 further includes two sample and hold (S/H) circuits (or sampling circuits) 406a, 406b, coupled in parallel to each other, and coupled in series with the multiplexer 404.

The recording circuit 400 further includes an analog-to-digital converter (ADC) (e.g. a successive approximation ADC, SAR ADC) 408 coupled in series with the two S/H circuits 406a, 406b and with the multiplexer 404. In various embodiments, the two S/H circuits 406a, 406b may be coupled between the multiplexer 404 and the ADC 408.

In operation, the multiplexer 404 receives a plurality of input signals 403a, 403b, 403c, e.g. through respective input terminals of the multiplexer 404, and then multiplexes the plurality of input signals 403a, 403b, 403c to produce a multiplexed output signal 410 to be outputted via an output terminal of the multiplexer 404 to the two S/H circuits 406a, 406b. Each of the two S/H circuits 406a, 406b samples a portion of the multiplexed output signal 410 and the two S/H circuits 406a, 406b alternately produce an output signal 412 to be supplied to the ADC 408, which then converts the signal 412 to a digital signal 414. As the two S/H circuits 406a, 406b are coupled in parallel, the two S/H circuits 406a, 406b may process (e.g. performing sample and hold actions) the respective portions of the multiplexed output signal 410 parallelly or simultaneously.

In various embodiments, the two S/H circuits 406a, 406b work in an alternate manner. That is, when one S/H circuit (e.g. 406a) is in the "holding" phase, where digitization of one analog input of an analog recording channel is carried out, the other S/H circuit (e.g. 406b) is in the "sampling" phase, where sampling of the signal from the next analog recording channel is carried out.

By adopting the dual S/H circuit architecture, the sampling/tracking time, $T_{sample}$, may be extended to $T_{ADC}$, from $T_{ADC}/(N+1)$ corresponding to the recording system 100 (FIGS. 1A and 1B), as the sample and hold actions are conducted in parallel as compared to in series for the recording system 100.

Figure 4B:
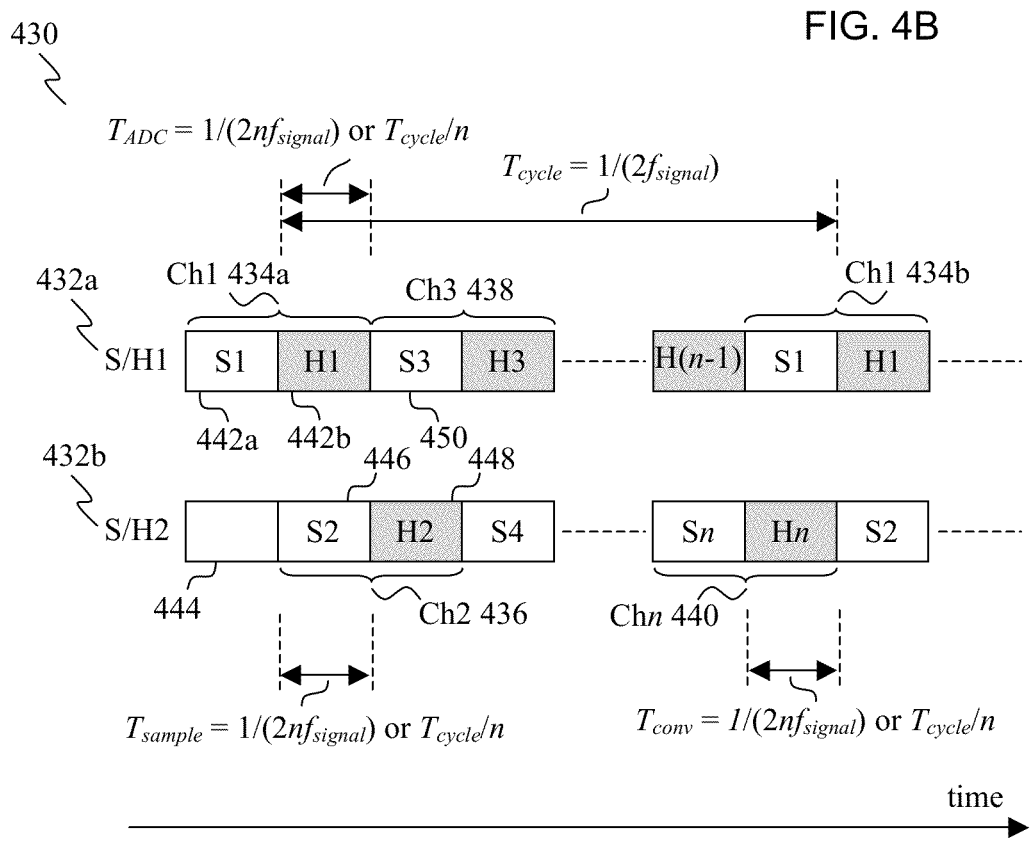
FIG. 4B shows a schematic diagram of a timing diagram for the recording circuit of FIG. 4A.

FIG. 4B shows a schematic diagram of a timing diagram 430 for the recording circuit 400 of FIG. 4A, illustrating the sampling and holding time intervals (i.e. circuit/system time allocation) for the dual S/H circuits with multiplexed analog input signals. In comparison to the timing diagram 120 (FIG. 1B), the extension in the tracking period or time interval, $T_{sample}$, for the recording circuit 400 may be clearly observed.

As shown in FIG. 4B, the S/H circuit, S/H1 432a (e.g. 406a, FIG. 4A), may process the input signal corresponding to channel 1, Ch1 434a, while S/H2 432b (e.g. 406b, FIG. 4A) may process the input signal corresponding to channel 2, Ch2 436. Subsequent input signals from successive channels are then repeatedly processed by S/H1 432a and S/H2 432b. For example, S/H1 432a subsequently processes the input signals corresponding to channel 3, Ch3 438, channel 5, Ch5, channel (n−1), Ch(n−1), and then back to channel 1, Ch1 434b, while S/H2 432b subsequently processes the input signals corresponding to channel 4, Ch4, channel 6, Ch6, channel n, Chn 440, and then back to channel 2, Ch2.

The respective time intervals indicated by 'S1', 'S2', ..., 'Sn' represent the sampling (tracking) period and the respective time intervals indicated by 'H1', 'H2', ..., 'Hn' represent the conversion (holding) period corresponding to the respective channels, Ch1 434, Ch2 436, ..., Chn 440. Using the input signal corresponding to Ch1 434a as a non-limiting example, the block 'S1' 442a and the block 'H1' 442b respectively represents the sampling period (time interval) and the conversion period (time interval) related to Ch1 434a. The cycle time or period, $T_{cycle}$, cycle between successive conversion actions of each S/H circuit 432a, 432b, is $1/(2f_{signal})$, where $f_{signal}$ is the bandwidth of the input signal. It should be appreciated that the various time intervals/durations are for illustration purposes and not drawn to scale.

As shown in FIG. 4B, there is a delay of a time interval, represented by block 444, between the starting points of the sampling time intervals (i.e. between the start of the respective sampling processes) of S/H1 432a and S/H2 432b.

In addition, as illustrated in FIG. 4B, S/H1 432a and S/H2 432b process the respective input signals in a parallel manner, where the respective overall sample and hold actions by S/H1 432a and S/H2 432b are performed in a parallel manner, where these overall actions overlap with each other. For example, while S/H1 432a is performing the hold action at H1 442b, S/H2 432b is performing the sample action at S2 446, and while S/H2 432b is performing the hold action at H2 448, S/H1 432a is performing the sample action at S3 450. Therefore, the individual sample actions and the individual hold actions are alternately performed by S/H1 432a and S/H2 432b, which alternately produce an output signal. Therefore, the individual sample actions performed by S/H1 432a and S/H2 432b do not overlap, and the individual hold actions performed by S/H1 432a and S/H2 432b do not overlap. However, the overall sample and hold actions performed by S/H1 432a and S/H2 432b overlap.

For the recording circuit 400 with dual S/H circuits 406a, 406b, the preceding buffers 402a, 402b, 402b have a longer time to charge or discharge the sampling capacitors of the S/H circuits 406a, 406b. As a result, the required output current of the buffer, $I_{buffer, dualSH}$, decreases significantly as compared to the conventional recording system 100 architecture (FIG. 1A). The required output current of the buffer, $I_{buffer, dualSH}$, of the recording circuit 400 may be expressed as $$I_{buffer,dualSH} = \frac{C_s \times \Delta V}{T_{sample}} = 2nf_{signal}C_s\Delta V, \quad \text{(Equation 5)}$$

where $C_s$ is the sampling capacitance of the S/H capacitor of S/H1 432a or S/H2 432b, $\Delta V$ is the voltage difference between the buffer output of the current channel and the previous channel at the time when sampling/tracking of the current channel starts, $T_{sample}$ is the sampling period, n is the number of analog inputs 403a, 403b, 403c or input channels, and $f_{signal}$ is the bandwidth of the analog input 403a, 403b, 403c.

The required bandwidth of the buffer, $f_{buffer, dualSH}$, may be estimated by the following equation $$f_{buffer,dualSH} \geq \frac{nf_{signal}}{\pi}\ln\left(\frac{2^{N+1}\Delta V}{V_{pp}}\right), \quad \text{(Equation 6)}$$

where $V_{PP}$ is the full-scale input range of the ADC 408, and N is the number of bits of the ADC 408.

By comparing Equation 1 to Equation 5, and Equation 4 to Equation 6, it may be seen that the required output current, $I_{buffer, dualSH}$, and the bandwidth of the buffer, $f_{buffer, dualSH}$, of the recording circuit 400 with a dual parallel S/H circuit architecture, are (N+1) times smaller than the recording system 100 adopting a conventional SAR ADC system. Consequently, the power consumption of the driving buffers 402a, 402b, 402c, of the recording circuit 400 decreases by more than (N+1) times. As the power consumption of the buffers 102a, 102b, 102c (FIG. 1A) are dominant in the multi-channel recording system 100, the power reduction of the overall recording circuit 400 is prominent as compared to the recording system 100.

Figure 1B:
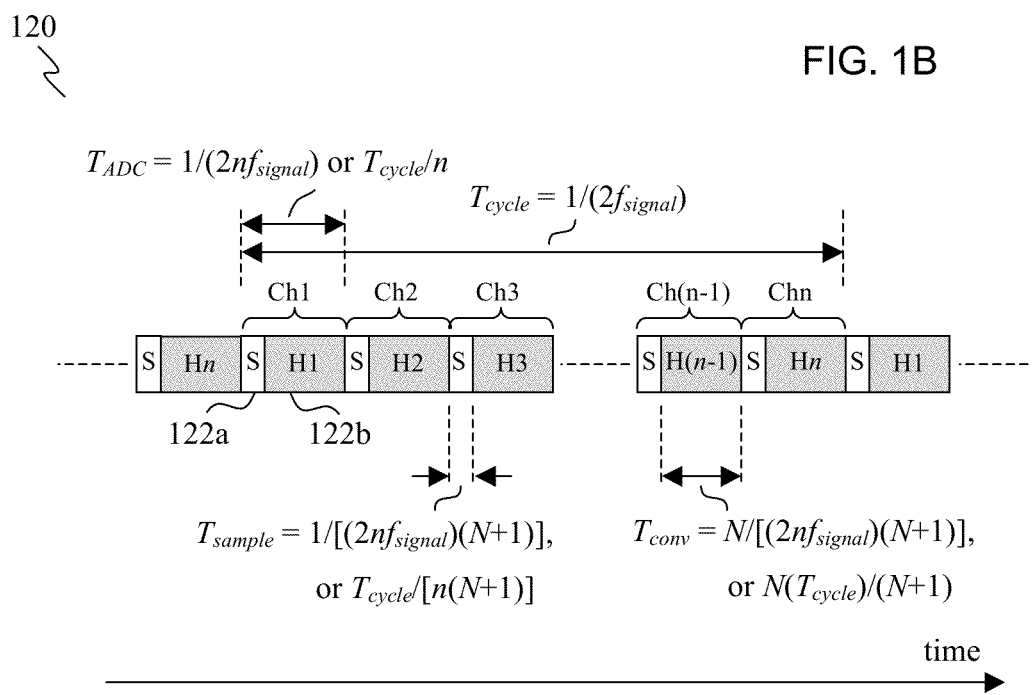
FIG. 1B shows a schematic diagram of a timing diagram for the recording system of FIG. 1A.

In addition, as shown in FIG. 1B and FIG. 4B, the conversion time interval, $T_{conv}$, is extended for the recording circuit 400, as the conversion activities occupy the whole time interval of $1/(2nf_{signal})$ or $T_{ADC}$, and there is no need for the conversion activities to share the same time interval of $1/(2nf_{signal})$ with the sampling actions. This may reduce the conversion clock frequency as well as the clock frequency of the ADC logic. Consequently, the power consumption of the clock-related modules (e.g. clock generator) may be decreased. In addition, the power consumption of the ADC logic may be reduced.

Figure 2A:
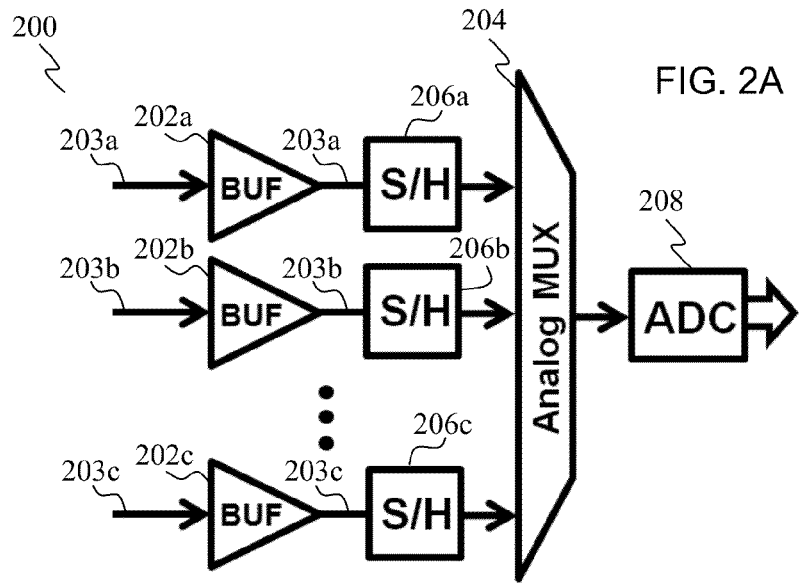
FIG. 2A shows a schematic diagram of a conventional multiplexed multi-channel recording system.

Furthermore, with a dual parallel S/H circuits 406a, 406b architecture for n-channel analog inputs in the recording circuit 400, the increment in the chip area is minimal compared to the recording system 200 (FIG. 2A).

In various embodiments, in order to minimise mismatch between the four S/H circuits, which may occur when the same analog channel is sampled by different S/H circuits, the recording circuit 400 may be employed to receive and process input signals from input channels of a number of multiples of 2 (e.g. 2, 4, 6, 8 or 10 input channels).

While three buffers 402a, 402b, 402c, and three analog inputs 403a, 403b, 403c are shown in FIG. 4A, it should be appreciated that there may be n number of buffers providing n number of analog inputs, where n≥2.

While the two S/H circuits 406a, 406b are shown separately, the two S/H circuits 406a, 406b may be different parts of a same circuit. Therefore, the two S/H circuits 406a, 406b may form part of an overall single circuit, instead of being two separate circuits.

While the two S/H circuits 406a, 406b are shown separate from the ADC 408, the two S/H circuits 406a, 406b may be or form part of the ADC 408.

It should be appreciated that the recording circuits of various embodiments may employ m number of S/H circuits, where m≥2, depending on the applications and/or the recording circuit power requirements and/or the recording circuit chip area requirements. It should be appreciated that, as long as the conversion activities in the m S/H circuits do not overlap with each other, the same digitization module (e.g. including ADC 408) may be shared by the m S/H circuits.

Figure 4C:
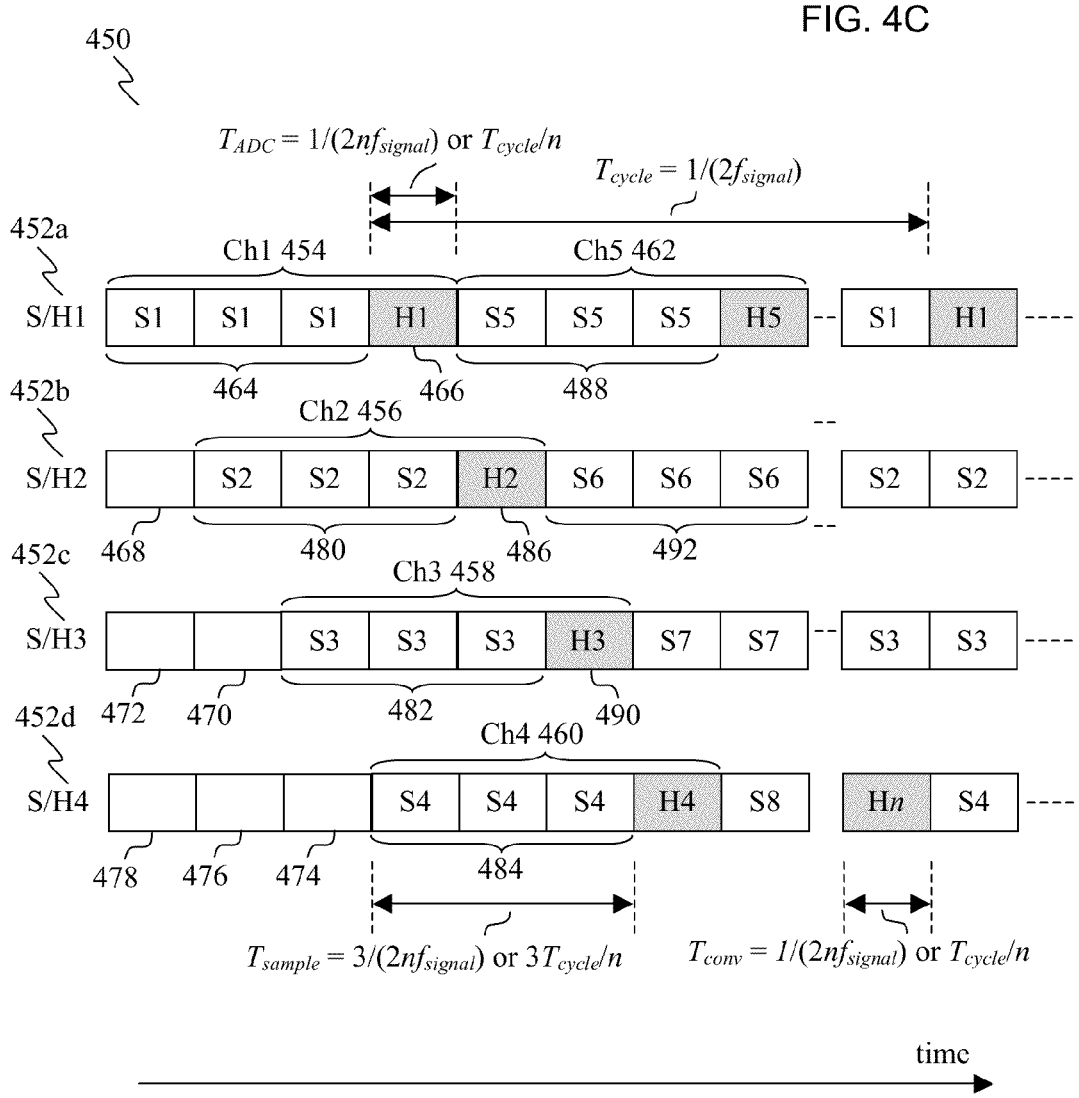
FIG. 4C shows a schematic diagram of a timing diagram for the recording circuit of various embodiments.

FIG. 4C shows a schematic diagram of a timing diagram 450 for the recording circuit of various embodiments, including four sampling circuits or S/H circuits electrically coupled to each other, in parallel. The timing diagram 450 illustrates the sampling and holding time intervals (i.e. circuit/system time allocation) for the four S/H circuits with multiplexed analog input signals.

As shown in FIG. 4C, the S/H circuit, S/H1 452a may process the input signal corresponding to channel 1, Ch1 454, S/H2 452b may process the input signal corresponding to channel 2, Ch2 456, S/H3 452c may process the input signal corresponding to channel 3, Ch3 458, while S/H4 452d may process the input signal corresponding to channel 4, Ch4 460.

Subsequent input signals from successive channels are then repeatedly processed by S/H1 452a, S/H2 452b, S/H3 452c and S/H4 452d. For example, S/H1 452a subsequently processes the input signals corresponding to channel 5, Ch5 462, channel (n−3), Ch(n−3), and then back to channel 1, Ch1. S/H2 452b subsequently processes the input signals corresponding to channel 6, Ch6, channel (n−2), Ch(n−2), and then back to channel 2, Ch2. S/H3 452c subsequently processes the input signals corresponding to channel 7, Ch7, channel (n−1), Ch(n−1), and then back to channel 3, Ch3. S/H4 452d subsequently processes the input signals corresponding to channel 8, Ch8, channel n, Chn, and then back to channel 4, Ch4.

The respective time intervals indicated by 'S1', 'S2', 'S3', . . . , represent the sampling (tracking) period and the respective time intervals indicated by 'H1', 'H2', 'H3', . . . , represent the conversion (holding) period corresponding to the respective channels, Ch1 454, Ch2 456, Ch3 458, . . . . Using the input signal corresponding to Ch1 454 as a non-limiting example, the three blocks 'S1' collectively represented as 464 and the block 'H1' 466 respectively represent the sampling period (time interval) and the conversion period (time interval) related to Ch1 454. The cycle time or period, $T_{cycle}$, between successive conversion actions of each S/H circuit 452a, 452b, 452c, 452d is $1/(2f_{signal})$, where $f_{signal}$ is the bandwidth of the input signal. It should be appreciated that the various time intervals/durations are for illustration purposes and not drawn to scale.

As shown in FIG. 4C, there is a delay of a time interval, represented by block 468, between the starting points of the sampling time intervals (i.e. between the start of the respective sampling processes) of S/H1 452a and S/H2 452b. There is also a delay of a time interval, represented by block 470, between the starting points of the sampling time intervals of S/H2 452b and S/H3 452c, and a delay of time intervals, represented by blocks 470, 472, between the starting points of the sampling time intervals of S/H1 452a and S/H3 452c. There is also a delay of a time interval, represented by block 474, between the starting points of the sampling time intervals ofn S/H3 452c and S/H4 452d, a delay of time intervals, represented by blocks 474, 476, between the starting points of the sampling time intervals of S/H2 452b and S/H4 452d, and a delay of time intervals, represented by blocks 474, 476, 478, between the starting points of the sampling time intervals of S/H1 452a and S/H4 452d.

In addition, as illustrated in FIG. 4C, S/H1 452a, S/H2 452b, S/H3 452c, and S/H4 452d process the respective input signals in a parallel manner, where the respective overall sample and hold actions by S/H1 452a, S/H2 452b, S/H3 452c, and S/H4 452d are performed in a parallel manner, where these overall sample and hold actions overlap with each other.

For example, while S/H1 452a is performing the sample action at S1 464, S/H2 452b may be performing the sample action at S2 480 and S/H3 452c may be performing the sample action at S3 482. While S/H1 452a is performing the hold action at H1 466, S/H2 452b is performing the sample action at S2 480, S/H3 452c is performing the sample action at S3 482, and S/H4 452d is performing the sample action at S4 484.

While S/H2 452b is performing the hold action at H2 486, S/H3 452c is performing the sample action at S3 482, S/H4 452d is performing the sample action at S4 484, and S/H1 452a is performing the sample action at S5 488.

While S/H3 452c is performing the hold action at H3 490, S/H4 452d is performing the sample action at S4 484, S/H1 452a is performing the sample action at S5 488, and S/H2 452b is performing the sample action at S6 492.

Therefore, the individual sample actions performed by S/H1 452a, S/H2 452b, S/H3 452c, S/H4 452d may overlap while the individual hold actions are alternately performed by S/H1 452a, S/H2 452b, S/H3 452c, S/H4 452d, which alternately produce an output signal. Therefore, the individual hold actions performed by S/H1 452a, S/H2 452b, S/H3 452c, and S/H4 452d do not overlap.

For a recording circuit of various embodiments, including four parallel S/H circuits coupled electrically, the sampling frequency of the associated ADC is ($2nf_{signal}$) according to the Nyquist rate, corresponding to a time period, $T_{ADC}$, of $T_{ADC}=1/(2nf_{signal})$, where $f_{signal}$ is the bandwidth of the input analog signal and n is the number of analog inputs. The tracking (or sampling) process occupies a time interval, $T_{sample}$, of $T_{sample}=(m-1) T_{ADC}(=3/(2nf_{signal}))$, where m is the number of S/H circuits. The conversion (or holding) time interval, $T_{conv}$, is $T_{conv}=T_{ADC} (=1/(2nf_{signal}))$.

For a recording circuit with four parallel S/H circuits, the associated preceding buffers have a longer time to charge or discharge the sampling capacitors of the S/H circuits, as compared to the recording circuit 400 (FIG. 4A). As a result, the required output current of the buffer, $I_{buffer, fourSH}$, decreases as compared to the recording circuit 400. The required output current of the buffer, $I_{buffer, fourSH}$, of the recording circuit with four parallel S/H circuits may be expressed as $$I_{buffer, fourSH} = \frac{C_s \times \Delta V}{T_{sample}} = \frac{2nf_{signal}C_s\Delta V}{3}. \quad \text{(Equation 7)}$$

The required bandwidth of the buffer, $f_{buffer, fourSH}$, may be estimated by the following equation $$f_{buffer, fourSH} \geq \frac{nf_{signal}}{3\pi}\ln\left(\frac{2^{N+1}\Delta V}{V_{pp}}\right). \quad \text{(Equation 8)}$$

Therefore, the required output current, $I_{buffer, fourSH}$, and the bandwidth of the buffer, $f_{buffer, fourSH}$, of the recording circuit with four parallel S/H circuits architecture, are ⅓ of that of the recording circuit 400. Consequently, the power consumption of the associated driving buffers of the recording circuit with four parallel S/H circuit decreases by ⅓.

Accordingly, by increasing the number of S/H circuits to m number, where m>2, the required output current, $I_{buffer}$, and the bandwidth of the buffer, $f_{buffer}$, of the recording circuit with m parallel S/H circuits, are (m−1) times smaller than the recording circuit 400. Consequently, the power consumption of the associated driving buffers of the recording circuit with m parallel S/H circuits decreases by more than (m−1) times. However, it should be appreciated that the recording circuit with m parallel S/H circuits occupies an increased chip area as compared to the recording circuit 400, to accommodate the additional (m−2) S/H circuits.

Figure 5:
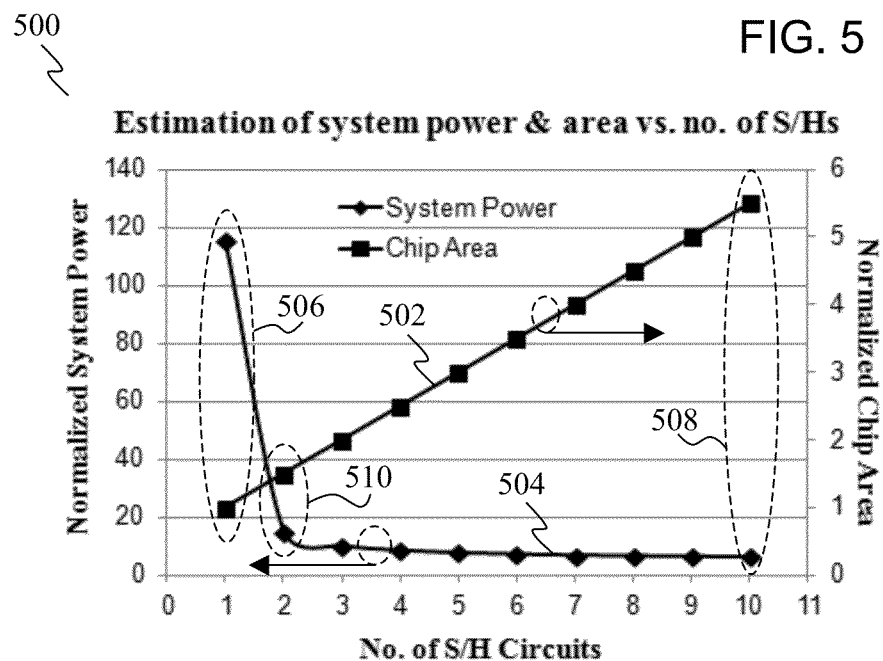
FIG. 5 shows a plot of system power and chip area as a function of the number of S/H circuits for the recording circuits of various embodiments.

FIG. 5 shows a plot 500 of circuit/system power and chip area as a function of the number of S/H circuits to illustrate the high power efficiency and area efficiency of the recording circuits of various embodiments. In order to obtain the results shown in FIG. 5, the following assumptions are made based on the recording circuits of various embodiments.

1. The power of the buffer in a recording circuit with dual parallel S/H circuits is 1 unit (1.5 μW).
2. The power of the ADC in a recording circuit with dual parallel S/H circuits is 8.3 units (12.5 μW).
3. The circuit/system power is the sum of the power of the buffer and the power of the ADC.
4. The ADC clock frequency is 2.7 MHz, and the analog sampling frequency is 24.5 kS/s (S=sample, s=second) per channel.
5. The S/H circuit area is half of the total ADC area for 1 S/H ADC, and the area of ADC with 1 S/H is 1 unit.
6. The resolution of the ADC is 10-bit, and one ADC supports 10 analog recording channels.

FIG. 5 shows that the increment in the chip area 502 is linear with the number of S/H circuits, while the power consumption 504 is non-linear with the number of S/H circuits. When the number of S/H circuits increases from 1 to 2, the power 504 decreases significantly. The power consumption and chip area associated with the recording system 100 (FIG. 1A) is shown by the dashed ellipse 506, while the power consumption and chip area associated with the recording system 200 (FIG. 2A) is shown by the dashed ellipse 508. The power consumption and chip area associated with the recording circuit 400 (FIG. 4A) is shown by the dashed ellipse 510, emphasizing the advantages over the conventional recording systems.

Figure 6:
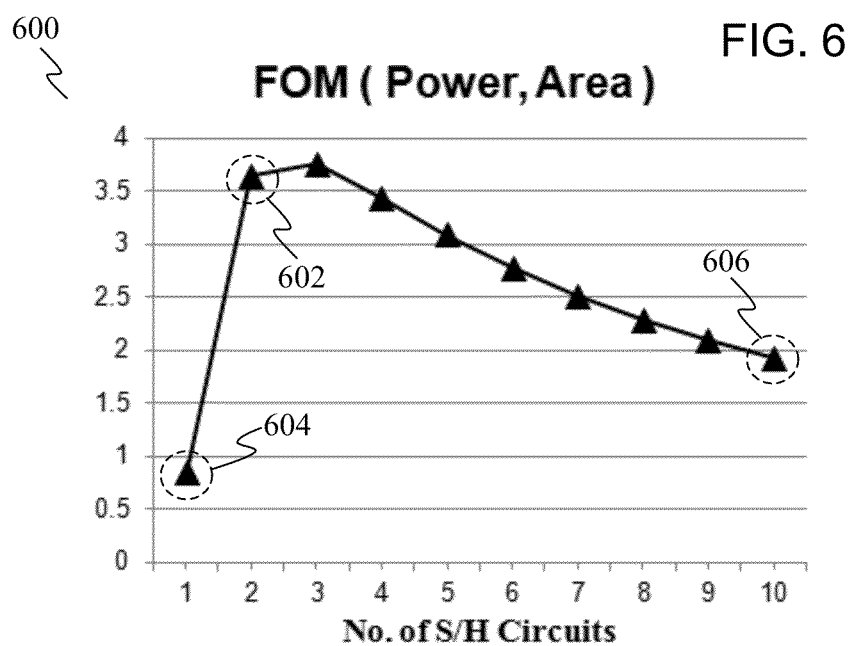
FIG. 6 shows a plot of figure of merit (FOM) as a function of the number of S/H circuits, based on 10 input channels per ADC, for the recording circuits of various embodiments.

FIG. 6 shows a plot 600 of figure of merit (FOM), in terms of circuit/system power and chip area, as a function of the number of S/H circuits, for the recording circuit of various embodiments, based on the results of FIG. 5 (i.e. based on a neural recording system with 1 ADC supporting 10 channels). As shown in FIG. 6, the recording circuit 400 achieves a much better FOM, as shown by the dashed circle 602, as compared to the FOM (dashed circle 604) for the recording system 100 (FIG. 1A) and the FOM (dashed circle 606) for the recording system 200 (FIG. 2A).

FIG. 6 indicates that a recording circuit with three parallel S/H circuits has a slightly better FOM than the recording circuit 400. However, there may be a challenge in that there may be a mismatch among the three S/H circuits that may affect the ADC performance as the same analog channel may be sampled by different S/H circuits. In addition, design complexity is also increased as additional S/H circuits are employed. Based on these considerations, the recording circuit 400 with two S/H circuits electrically coupled in parallel may provide an optimal circuit, at least for some applications and taking into consideration the power consumption requirements and/or the chip area requirements. However, it should be appreciated that, for example, where there are 9 (or multiples of 3) input channels, as the same analog channel is sampled by the same S/H circuit, mismatch may be minimised.

It should be appreciated that the number of S/H circuits may be more than 2 and different applications may lead to different shapes for the results of circuit/system power and chip area as a function of the number of S/H circuits, as per FIG. 5, and/or the results of FOM, as per FIG. 6. Therefore, the optimal number of S/H circuits may be selected, depending on the application and taking into consideration the power consumption requirements and/or the chip area requirements. For example, where a recording circuit with four S/H circuits electrically coupled in parallel of various embodiments may provide an improved FOM, for example as compared to the recording circuit 400, four S/H circuits may be employed, and the sample and hold timing diagrams are as illustrated in FIG. 4C. As long as the conversion activities corresponding to the four S/H circuits do not overlap, the same digitization module may be shared by the four S/H circuits. In order to minimise mismatch among the four S/H circuits, such a recording circuit may be employed to receive and process input signals from input channels of a number of multiples of 4 (e.g. 4, 8, 12 or 16 input signals).

Accordingly, the overall recording circuit architecture may be designed with high flexibility to achieve an optimal power and area trade-off with customized number of S/H circuits in the recording circuit/system. In other words, the number of S/H circuits may be varied in order to achieve a balance in the trade-off between the circuit power and the circuit chip area in the recording circuits of various embodiments.

The recording circuit 400 may be implemented in a low power neural recording integrated circuit (IC), which is designed based on the 0.18-μm CMOS technology. Table 1 provides the performance summary of the circuit. The recording circuit 400 may have minimal settling error, e.g. few to tens of μV settling error.

TABLE 1

| Parameter | Value |
| --- | --- |
| Buffer current (μA) | 1.5 |
| Buffer power (μW) | 1.5 |
| ADC power (μW) | 24 |
| ADC resolution (bit) | 9 |
| ADC sampling frequency (kHz) | 245 |
| ADC clock frequency (MHz) | 2.7 |
| Power/channel (μW) | 3.9 |
| Area/channel (mm$^2$) | 0.08-0.15 |

Figure 2B:
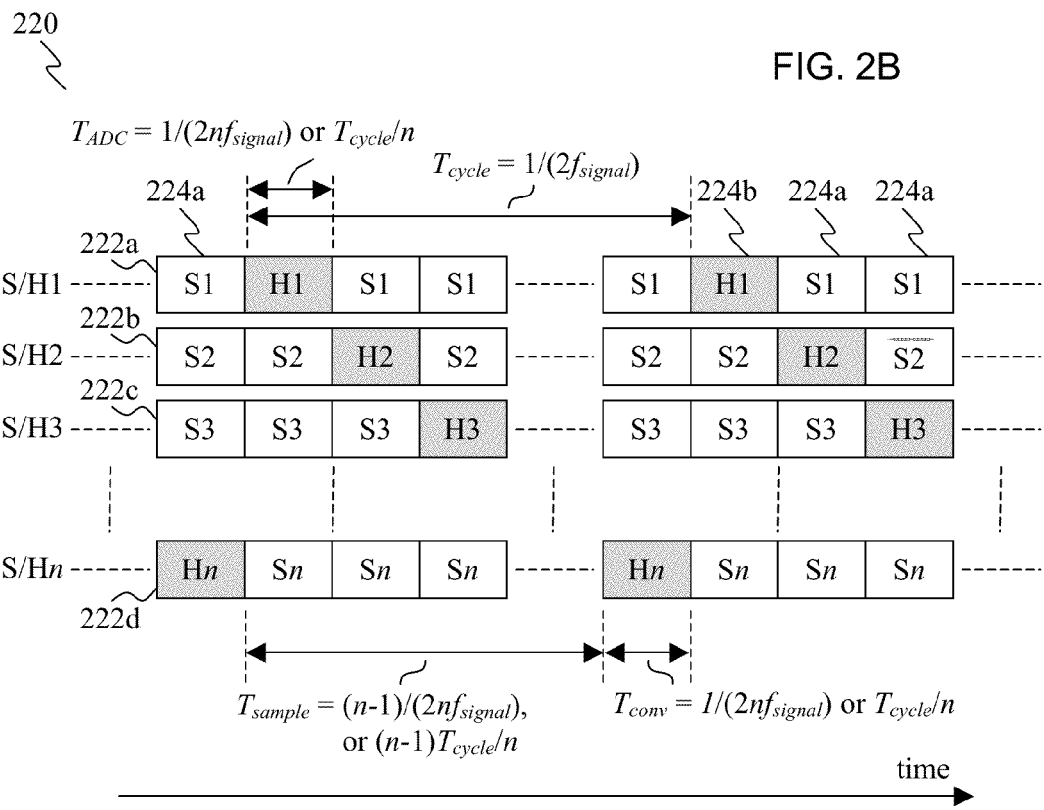
FIG. 2B shows a schematic diagram of a timing diagram for the recording system of FIG. 2A.

A non-limiting example of a comparison of the recording system 100 (FIGS. 1A and 1B), the recording system 200 (FIGS. 2A and 2B) and the recording circuit 400 (FIGS. 4A and 4B) is now described based on $f_{signal}$=10 kHz, an N-bit ADC with N=10, n analog input channels with n=10, $C_s$=3 pF and ΔV=0.8 V.

For the recording system 100, the sampling time, $T_{sample}$, is about 0.45 μs (=1/[(2n$f_{signal}$)(N+1)]=1/[(2×10×10k)(10+1)]), and therefore the output current of the buffer, $I_{buffer}$, is about 5.3 μA (=($C_s$×ΔV)/$T_{sample}$=(3×10$^{-12}$×0.8)/(0.45×10$^{-6}$)). The chip area for 1 S/H circuit and 1 ADC is approximately 0.05 mm$^2$.

For the recording system 200, the sampling time, $T_{sample}$, is about 45 μs (=(n−1)/(2n$f_{signal}$)=(10−1)/(2×10×10k)), and therefore the output current of the buffer, $I_{buffer}$, is about 0.05 μA (=($C_s$×ΔV)/$T_{sample}$=(3×10$^{-12}$×0.8)/(45×10$^{-6}$)). The chip area for 10 S/H circuits and 1 ADC is approximately 0.23 mm$^2$.

For the recording circuit 400, the sampling time, $T_{sample}$, is about 5 μs (=1/(2n$f_{signal}$)=1/(2×10×10k)), and therefore the output current of the buffer, $I_{buffer}$, is about 0.48 μA (=($C_s$×ΔV)/$T_{sample}$=(3×10$^{-12}$×0.8)/(5×10$^{-6}$)). The chip area for 2 S/H circuits and 1 ADC is approximately 0.07 mm$^2$.

The recording circuits of various embodiments may provide at least one or more of the following advantages.

High Power Efficiency by Extending the Tracking Time of the ADC.

The recording system 100 (FIG. 1A) with multiplexed analog inputs handles all the sample and hold activities in a serial mode. This introduces the problem that when the ADC is performing conversion, the analog inputs are idle, and when the tracking process takes place, the logic and the register array of the ADC are idle.

In contrast, for the recording circuits of various embodiments, the sample and hold actions are performed in a parallel mode. This approach extends the process time of the tracking operation by more than N times, where N is the number of bits of the ADC in the recording circuits. Therefore, the power consumption of the associated buffers of the recording circuits is relaxed by more than N times, providing an effective approach for a low power multi-channel recording circuit, for example for biomedical devices. In addition, the ADC conversion clock frequency is also decreased, leading to a reduced power consumption of the clock related modules and/or the ADC logic module.

High Area Efficiency for n-Channel Analog Inputs.

Minimum circuit/system power may be achieved by employing one S/H circuit for every analog input channel. This approach gives maximum tracking time and requires minimum current for the buffer. However, the sampling capacitor of a S/H circuit usually takes up a significant portion of the silicon area of the overall system. Therefore, coupling each analog input with one S/H circuit results in a significant increase in the total system area. When chip area comes into consideration, this approach is less attractive even though a low system power is achieved.

The power consumption of the buffer may no longer be the dominant parameter when the number of the S/H circuits is 2 or more, for n-channel analog inputs (n≥2). As a result, a further increase in the number of the S/H circuits has a minimal effect on the overall circuit/system power. The recording circuit 400 of various embodiments, with two parallel S/H circuits, may achieve a power reduction of about 10 times for the buffers 402a, 402b, 402c, with minimal area increment to the overall circuit. Therefore, the approach of various embodiments may achieve an optimal or balance of the circuit/system power and chip area trade-off.

High Flexibility to Achieve Optimal Power Area Trade-Off.

The recording circuits of various embodiments is not limited to two parallel S/H circuits, but may be extended to more than two S/H circuits (e.g. three, four, five or more S/H circuits) to fit different applications. When the budget for power consumption is limited while the chip area has relatively relaxed requirements, the number of the S/H circuits may be increased to further extend the tracking time and to reduce the circuit power consumption. The high flexibility of the design of the recording circuits of various embodiments provides an efficient and effective approach to optimize both the circuit power and the chip area, allowing the recording circuits of various embodiments to be employed in designs or devices with limited budget for power consumption and/or chip area.

In view of the above, various embodiments may provide a power efficient and/or a chip area efficient (e.g. low power consumption and/or small chip area) multi-channel recording circuit for neural recording sensor interface IC for multi-channel neural recording. The recording circuit may include multiplexed analog inputs and two parallel S/H circuits. With the two S/H circuits working in an interleaved mode, sampling of one channel is carried out while the ADC is digitizing the previous channel. By doing so, the sampling time of the ADC may be extended to (N+1) times compared to conventional ADC structure (e.g. FIG. 1A), where N is the number of bits of the ADC. This leads to more than (N+1) time power saving for the associated preceding driving buffer(s) of the ADC, which may be the bottle neck for reducing the circuit power consumption in biomedical multi-channel recording systems. At the same time, the circuit area increment may be maintained to be minimal. Therefore, the recording circuits of various embodiments may reduce the overall circuit power consumption with negligible increase in chip area.

Various embodiments also provide an approach for optimizing the circuit power and chip area, which may lead to a high power efficient and area efficient circuit architecture for various applications of power-efficient multi-channel biomedical signal recording.

Various embodiments also provide a low design complexity and/or cost effective approach for recording circuits for multi-channel recording.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

We claim:

1. A recording circuit comprising:
   a multiplexing circuit configured to receive a plurality of input signals and to produce a multiplexed output signal comprising the plurality of input signals; and
   a plurality of sampling circuits electrically coupled in parallel to each other, each sampling circuit being configured to sample a portion of the multiplexed output signal corresponding to an input signal of the plurality of input signals and the sampling circuits configured to alternatively hold the sampled portion to alternately produce an output signal corresponding to the sampled portion.

2. The recording circuit as claimed in claim 1, further comprising an analogue-to-digital converter configured to receive the output signal.

3. The recording circuit as claimed in claim 1, further comprising a plurality of buffers, each buffer being configured to supply an input signal of the plurality of input signals to the multiplexing circuit.

4. The recording circuit as claimed in claim 1, wherein the number of the plurality of sampling circuits is less than the number of the plurality of input signals.

5. The recording circuit as claimed in claim 1, wherein the recording circuit comprises two sampling circuits.

6. The recording circuit as claimed in claim 1, wherein the recording circuit comprises three sampling circuits.

7. A method of controlling a recording circuit, the method comprising:
   multiplexing a plurality of input signals to produce a multiplexed output signal;
   sampling a portion of the multiplexed output signal corresponding to an input signal of the plurality of input signals via each sampling circuit of a plurality of sampling circuits electrically coupled in parallel to each other; and
   holding alternately the sampled portion to produce alternately an output signal corresponding to the sampled portion from the sampling circuits.

8. The method as claimed in claim 7, further comprising converting the output signal to a digital signal.

9. The method as claimed in claim 8, wherein converting the output signal to a digital signal comprises converting over a time interval, $T_{conv}$, defined by $$T_{conv} = \frac{1}{(2nf_{signal})},$$

where n is the number of the plurality of input signals, and $f_{signal}$ is a bandwidth of each input signal of the plurality of input signals.

10. The method as claimed in claim 7, wherein the number of the plurality of sampling circuits is less than the number of the plurality of input signals.

11. The method as claimed in claim 7, wherein the method comprises sampling the multiplexed output signal via two sampling circuits.

12. The method as claimed in claim 7, wherein the method comprises sampling the multiplexed output signal via three sampling circuits.

13. The method as claimed in claim 7, wherein sampling a portion of the multiplexed output signal comprises sampling over a time interval, $T_{sample}$, defined by $$T_{sample} = \frac{(m-1)}{(2nf_{signal})},$$

where m is the number of the plurality of sampling circuits, n is the number of the plurality of input signals, and $f_{signal}$ is a bandwidth of each input signal of the plurality of input signals.

* * * * *